United States Patent
Toh et al.

(10) Patent No.: US 11,821,924 B2
(45) Date of Patent: Nov. 21, 2023

(54) ON-CHIP CURRENT SENSOR

(71) Applicant: GLOBALFOUNDRIES Singapore Pte. Ltd., Singapore (SG)

(72) Inventors: Eng Huat Toh, Singapore (SG); Yongshun Sun, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/684,683

(22) Filed: Mar. 2, 2022

(65) Prior Publication Data
US 2023/0280378 A1    Sep. 7, 2023

(51) Int. Cl.
*G01R 15/20* (2006.01)
*G01R 33/07* (2006.01)

(52) U.S. Cl.
CPC ......... *G01R 15/202* (2013.01); *G01R 33/077* (2013.01)

(58) Field of Classification Search
CPC ............................ G01R 15/202; G01R 33/077
USPC ........................................................ 324/251
See application file for complete search history.

(56) References Cited

U.S. PATENT DOCUMENTS

| | | | |
|---|---|---|---|
| 4,806,855 A * | 2/1989 | Davis | H02J 13/00022 |
| | | | 324/127 |
| 7,598,601 B2 | 10/2009 | Taylor et al. | |
| 8,749,005 B1 * | 6/2014 | Foletto | G01R 33/077 |
| | | | 324/207.2 |
| 2021/0088600 A1 * | 3/2021 | Hoegerl | G01R 15/202 |
| 2021/0148730 A1 * | 5/2021 | David | G01D 5/16 |
| 2022/0246840 A1 * | 8/2022 | Schmidt | H10N 52/80 |

FOREIGN PATENT DOCUMENTS

| | | | | |
|---|---|---|---|---|
| CN | 103487632 A | * | 1/2014 | |
| CN | 212932758 U | * | 4/2021 | G01R 15/202 |
| EP | 1107328 | | 6/2001 | |
| EP | 1581817 | | 10/2005 | |
| EP | 3508864 A1 | * | 7/2019 | G01R 15/207 |
| WO | WO 9119455 A1 | * | 12/1991 | H05K 9/00 |
| WO | WO-2020104998 A1 | * | 5/2020 | G01R 33/072 |

OTHER PUBLICATIONS

Crescentini et al., "A Broadband, On-Chip Sensor Based on Hall Effect for Current Measurements in Smart Power Circuits", IEEE transactions on instrumentation and measurements, vol. 67, No. 6, Jun. 2018, Abstract, 2 pages.

* cited by examiner

*Primary Examiner* — Tung X Nguyen
*Assistant Examiner* — Robert P Alejnikov, Jr.
(74) *Attorney, Agent, or Firm* — Anthony Canale; Andrew M. Calderon; Calderon Safran & Cole P.C.

(57) ABSTRACT

The present disclosure relates to semiconductor structures and, more particularly, to an on-chip current sensor. The on-chip current sensor includes: a vertical Hall sensor; and a current carrying conductor in a first wiring layer above the vertical Hall sensor.

19 Claims, 4 Drawing Sheets

ON-CHIP CURRENT SENSOR

BACKGROUND

The present disclosure relates to semiconductor structures and, more particularly, to an on-chip current sensor and methods of manufacture.

A Hall sensor is a type of sensor which detects the presence and magnitude of a magnetic field using the Hall effect. For example, the output voltage of a Hall sensor is directly proportional to the strength of the field. Hall sensors are used for proximity sensing, positioning, speed detection, and current sensing applications. For example, Hall sensors are commonly used to time the speed of wheels and shafts for internal combustion engine ignition timing, tachometers, anti-lock braking systems and a position of a permanent magnet in brushless DC electric motors.

In a situation in which the Hall sensor is used as a current sensing application, it can sense the magnet field generated by a current to be sensed by a current carrying conductor (e.g., wire). In this way, the Hall sensor can sense the current indirectly. In current configurations, the placement of the current carrying conductor has a large distance between the sensor and the conductor which results in lower sensitivity due to a weaker magnetic field from such long distances. For example, an on-chip planar Hall sensor requires the Hall sensor to be placed with an offset requiring a longer distance to the current carrying conductor.

SUMMARY

In an aspect of the disclosure, a structure comprises: a vertical Hall sensor; and a current carrying conductor in a first wiring layer above the vertical Hall sensor.

In an aspect of the disclosure, a structure comprises: a front end of a line Hall sensor; and a back end of the line current carrying conductor aligned with and over the Hall sensor in a first wiring level.

In an aspect of the disclosure, a method comprises: forming a vertical Hall sensor in a front end of line process; and forming a current carrying conductor in a first wiring layer above the vertical Hall sensor in a back end of the line process.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to an on-chip current sensor and methods of manufacture. More specifically, the on-chip current sensor comprises a vertical Hall sensor for differential sensing of a current. In embodiments, a current carrying conductor is provided over the vertical Hall sensor in a first wiring layer. Advantageously, by having the current carrying conductor over the vertical Hall sensor in a first wiring layer it is now possible to achieve much higher and more accurate sensitivity as compared to conventional configurations.

In more specific embodiments, the current carrying conductor comprises a back end of the line (BEOL) metal line (e.g., in a first metal line) above a front end of the line (FEOL) vertical Hall sensor. As the current sensor is a vertical Hall sensor it is possible to have the Hall sensor directly underneath the current carrying conductor located at a first metal line, reducing the distance between the current carrying conductor and the Hall sensor. That is, the use of a vertical Hall sensor allows it to be placed directly under the current carrying conductor giving the shortest distance possible with no loss from projection to another axis, compared to a planar Hall device. In this way, the vertical Hall sensor may provide much higher and more accurate sensitivity (>2x or 1-2 orders) due to the closer distance and accurate alignment between the current carrying conductor and the vertical Hall sensor. The vertical Hall sensor may also be provided in a smaller sensor system area due to the integrated on-chip current carrying conductor which avoids usage of larger or thicker metal lines at a package level to generate sufficient field or for misalignment tolerance.

The on-chip current sensor of the present disclosure can be manufactured in a number of ways using a number of different tools. In general, though, the methodologies and tools are used to form structures with dimensions in the micrometer and nanometer scale. The methodologies, i.e., technologies, employed to manufacture the on-chip current sensor of the present disclosure have been adopted from integrated circuit (IC) technology. For example, the structures are built on wafers and are realized in films of material patterned by photolithographic processes on the top of a wafer. In particular, the fabrication of the on-chip current sensor uses three basic building blocks: (i) deposition of thin films of material on a substrate, (ii) applying a patterned mask on top of the films by photolithographic imaging, and (iii) etching the films selectively to the mask.

Figure 1A:
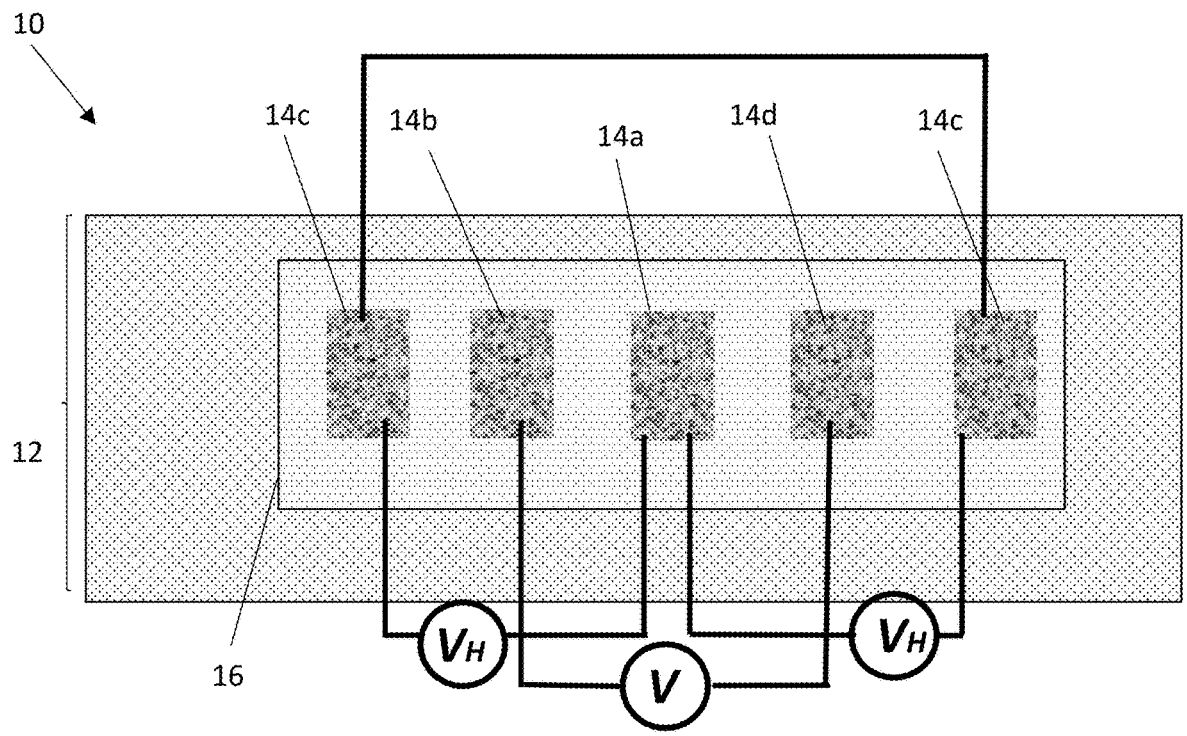
FIG. 1A shows a top view of an example vertical Hall sensor and respective fabrication processes in accordance with aspects of the present disclosure.
Figure 1B:
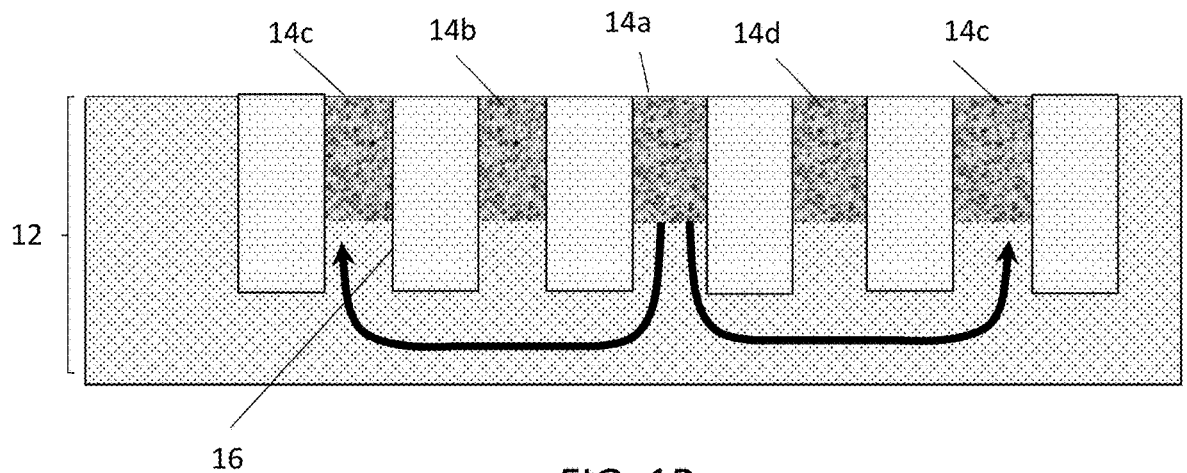
FIG. 1B shows a cross-sectional view of the vertical Hall sensor of FIG. 1.

FIG. 1A shows a top view of an example vertical Hall sensor and FIG. 1B shows a cross-sectional view of the vertical Hall sensor of FIG. 1A. It should be understood by those of ordinary skill in the art that the Hall sensor shown in FIGS. 1A and 1B is only one example of a Hall sensor and that other Hall sensors are contemplated for use in accordance with aspects of the present disclosure. For example, a three (3) terminal vertical Hall sensor may be used with a current carrying conductor as described herein.

More specifically as shown in FIGS. 1A and 1B, the vertical Hall sensor 10 may include a substrate (e.g., sensor body) 12 comprising a plurality of nodes, e.g., diffusion regions, 14a, 14b, 14c, 14d. In embodiments, the substrate (e.g., sensor body) 12 may be composed of any suitable lightly doped (e.g., N-doped) semiconductor material including, but not limited to, Si, SiGe, SiGeC, SiC, GaAs, InAs, InP, and other III/V or II/VI compound semiconductors. In embodiments, the substrate (e.g., sensor body) 12 may be an epitaxial semiconductor material epitaxially grown on a wafer, e.g., semiconductor on insulator (SOI) or bulk wafer.

The nodes 14a, 14b, 14c, 14d may comprise a higher doping concentration (e.g., N+ doped) than the substrate (e.g., sensor body) 12. The nodes 14a, 14b, 14c, 14d may be electrically isolated from one another by shallow trench isolation regions or oppositely doped regions, e.g., P type regions, either of which are designated at reference numeral 16.

In operation, in a five (5) terminal Hall sensor, the current travels from input node 14a to output nodes 14c (or vice versa) as shown by the arrows in FIG. 1B and the current will be sensed in nodes 14b, 14d. In embodiments, nodes 14c are electrically connected to another. Alternatively, in a five (5) terminal Hall sensor, current can flow from input node 14b to output node 14d (or vice versa), and sensed in nodes 14a, 14c. In any of these scenarios, the vertical Hall sensor 12 produces $V_H$ (+$V_H$ and –$V_H$, respectively). And, as is known by one of skill in the art, current magnitude is proportional to $V_H$.

Although not critical to the understanding of the present invention, the nodes 14a, 14b, 14c, 14d and the P type regions 16 may be formed by introducing a dopant by, for example, ion implantation that introduces a concentration of a dopant in the substrate 12. The nodes 14a, 14b, 14c, 14d and the P type regions 16 may be formed by introducing a concentration of a different dopant of opposite conductivity type in the substrate 12. In embodiments, respective patterned implantation masks may be used to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. The nodes 14a, 14b, 14c, 14d may be doped with n-type dopants, e.g., Arsenic (As), Phosphorus (P) and Sb, among other suitable examples, whereas the P type regions 16 may be doped with p-type dopants, e.g., Boron (B).

On the other hand, shallow trench isolation structures can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to transfer the pattern from the resist layer to the substrate 12 to form one or more trenches in the substrate 12. Following the resist removal by a conventional oxygen ashing process or other known stripants, insulator material (e.g., oxide) can be deposited by any conventional deposition processes, e.g., chemical vapor deposition (CVD) processes. Any residual material on the surface of the substrate 12 can be removed by conventional chemical mechanical polishing (CMP) processes.

Figure 2:
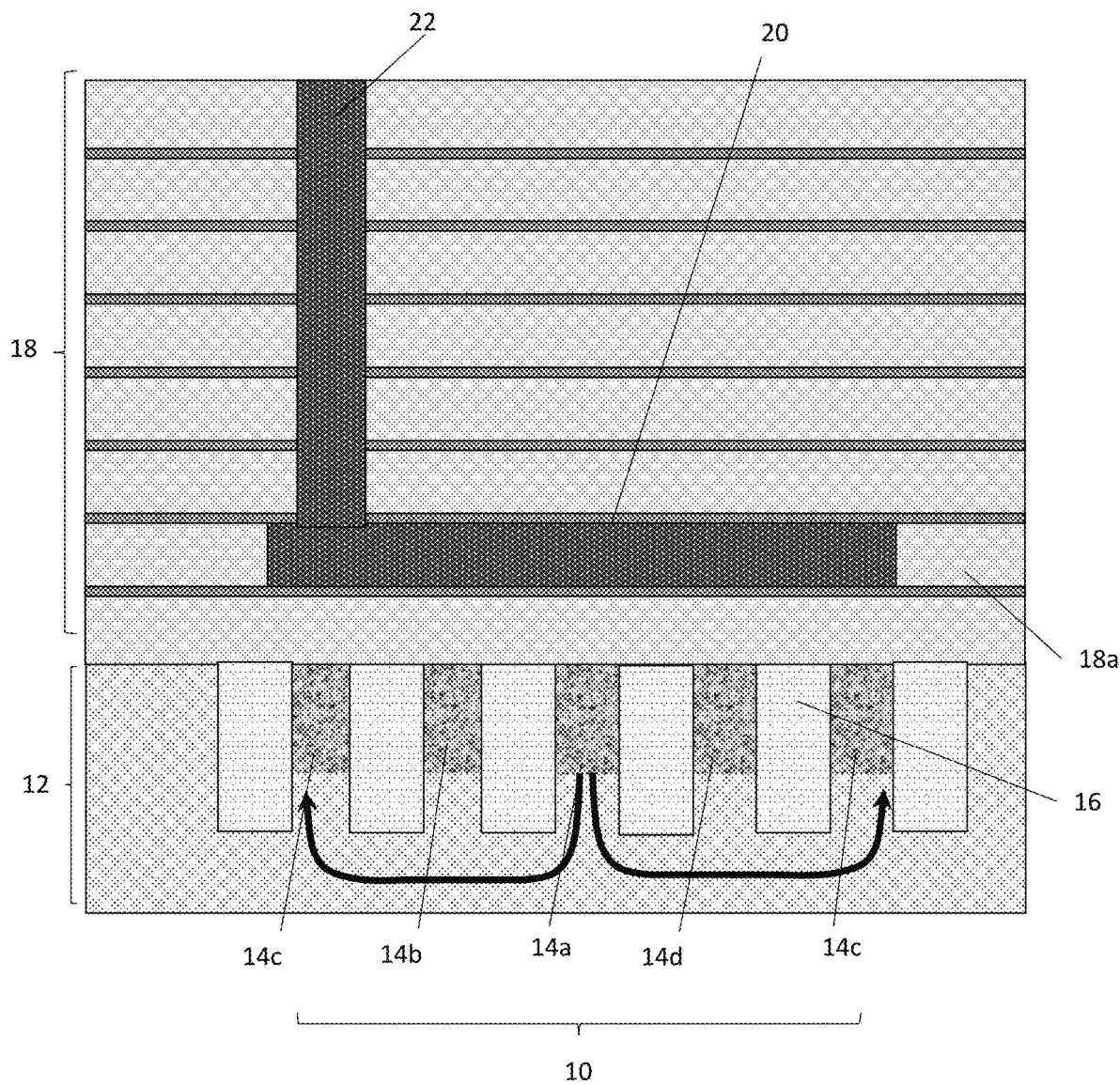
FIG. 2 shows a current carrying conductor above the vertical Hall sensor and respective fabrication processes in accordance with aspects of the present disclosure.

FIG. 2 shows a current carrying conductor 20 above the vertical Hall sensor 10. In this embodiment, the vertical Hall sensor 10 may be a FEOL structure and the current carrying conductor 20 may be a BEOL metal used as the current carrying conductor.

More specifically, in embodiments, the current carrying conductor 20 may be a metal line formed within a first wiring layer 18a of a plurality of wiring layers 18. In embodiments, the wiring layers 18 may be composed of alternating layers of oxide material and nitride material, e.g., interlevel dielectric material. The current carrying conductor 20 may be connected to a package (e.g., outside world) shown by highly representative wiring and via structures 22.

In even more specific embodiments, the current carrying conductor 20 may be directly above and in alignment with the vertical Hall sensor 10, which reduces the distance between the vertical Hall sensor 10 and the current carrying conductor 20 hence improving the sensitivity (e.g., larger magnetic field from a closer distance) of the vertical Hall sensor 10. For example, the vertical Hall sensor 10 may be placed directly underneath the current carrying conductor 20 to achieve minimum distance for a maximum magnetic field (as the vertical sensor senses magnetic field parallel to wafer surface generated by current carrying conductor). Also, as should be understood by those of skill in the art, the vertical Hall sensor 10 may be placed in a different direction with respect to current carrying conductor 20 to produce +$V_H$ and –$V_H$, respectively, as shown in FIG. 1A. And current magnitude is proportional to $V_H$, with a larger $V_H$ resulting in a more sensitive sensor, with the differential signal providing a larger sensitivity which is converted to sense the incoming current.

By way of one illustrative example, the distance between the vertical Hall sensor 10 and the current carrying conductor 20 may be about 1 μm to about 10 μm. In the configuration in which the current carrying conductor 20 is about 1 μm to about 10 μm from the vertical Hall sensor 10, the magnetic field generated on the vertical Hall sensor 10 and the Hall voltage from the vertical Hall sensor 10 may be significantly improved compared to conventional configurations. That is, a much higher magnetic field and Hall voltage (e.g., 1~2 orders magnitude) can be achieved due to the much closer distance between the current carrying conductor 20 and vertical Hall sensor 10, compared to package level sensing systems.

In embodiments, the current carrying conductor 20 may be fabricated using conventional lithography, etching and deposition processes. For example, the current carrying conductor 20 may be a wire of any appropriate conductive material, e.g., tungsten or aluminum or copper, by forming a resist over the insulator material and exposing the resist to energy (light) to form a pattern (opening). An etching process with a selective chemistry, e.g., RIE, will be used to transfer the pattern into the first wiring level of insulator material through the openings of the resist. Following the resist removal, the conductive material can be deposited by any conventional deposition processes, e.g., chemical vapor deposition (CVD) processes. Any residual material on the surface of the insulator material can be removed by conventional chemical mechanical polishing (CMP) processes.

Figure 3:
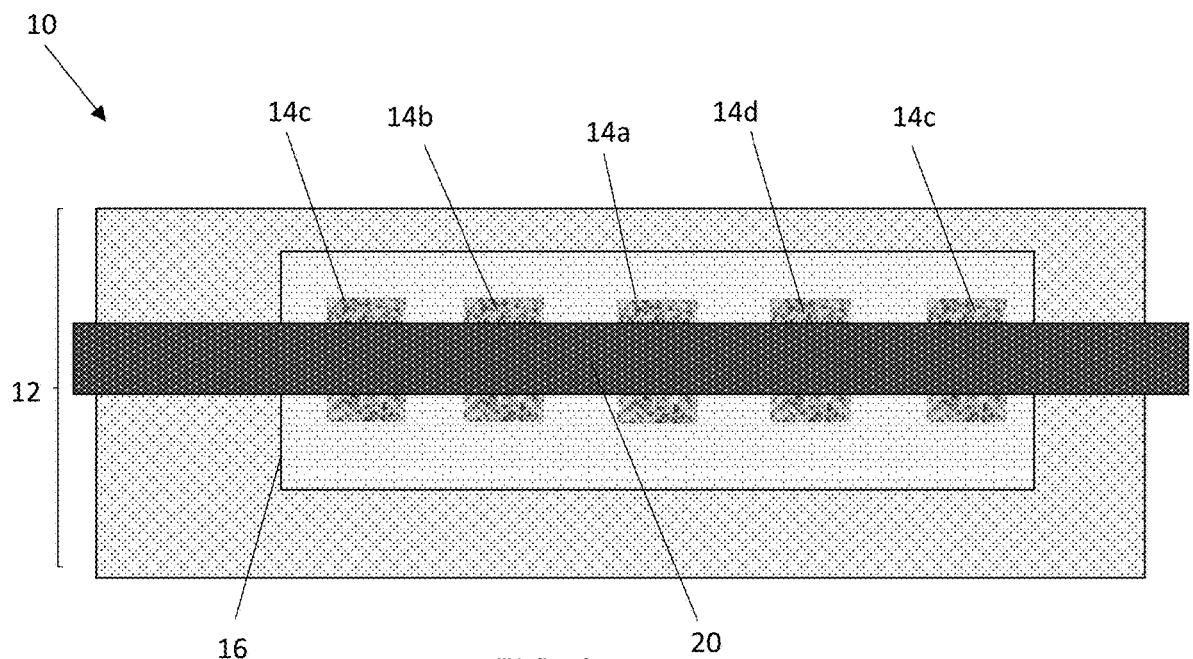
FIG. 3 shows a top view of the current carrying conductor above the vertical Hall sensor in accordance with aspects of the present disclosure.

FIG. 3 shows a top view of the current carrying conductor 20 above the vertical Hall sensor 10. As shown in this representation, the current carrying conductor 20 is a wiring line that spans directly above the vertical Hall sensor 10.

Figure 4:
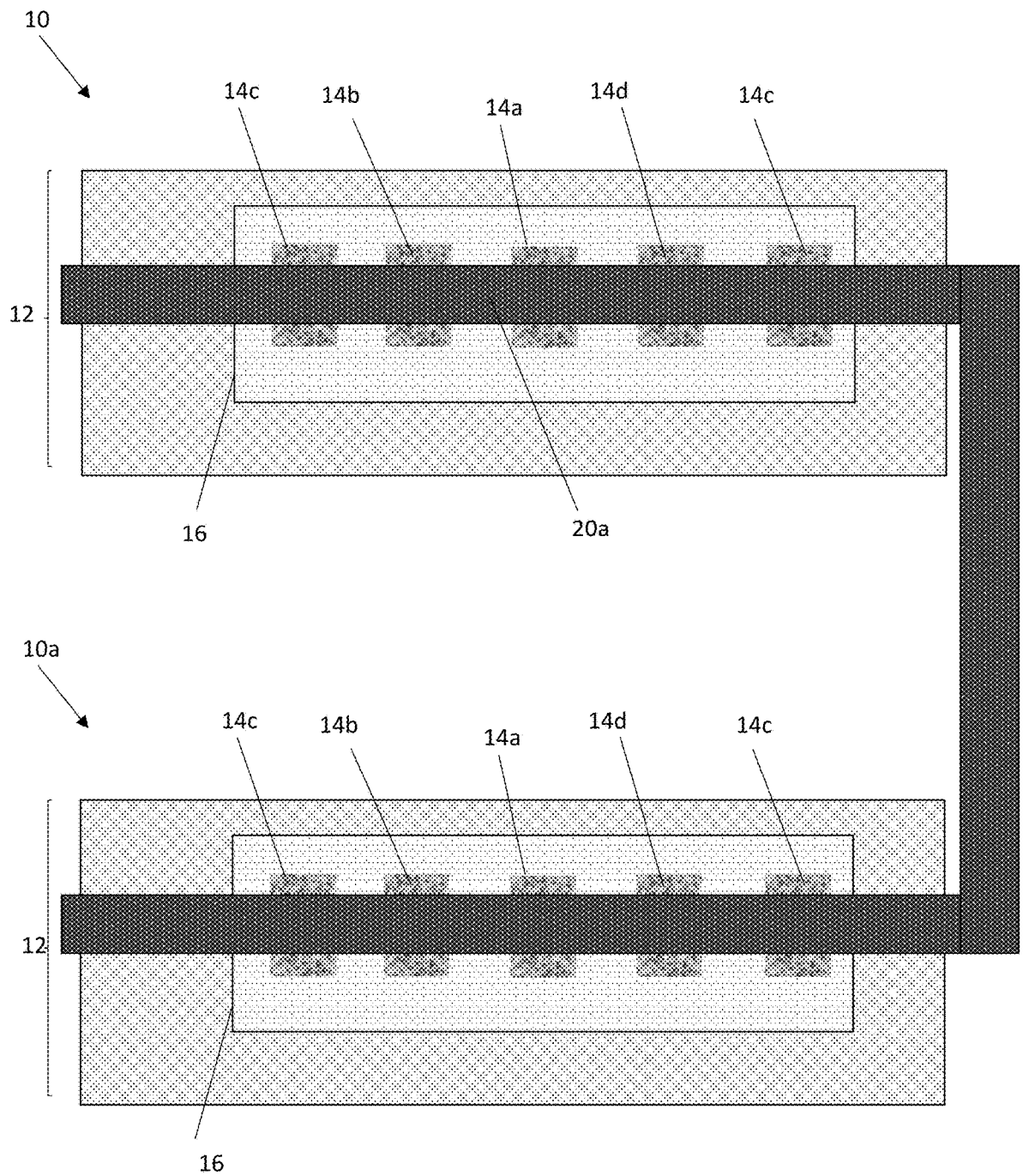
FIG. 4 shows a top view of the current carrying conductor above two vertical Hall sensors in accordance with aspects of the present disclosure.

FIG. 4 shows a top view of the current carrying conductor 20a above two vertical Hall sensors 10, 10a. As shown in this representation, the current carrying conductor 20a is a U-shaped wiring line that spans directly above both the vertical Hall sensors 10, 10a. The use of two vertical Hall sensors 10, 10a also increases the sensitivity of the differential sensing.

Figure 5:
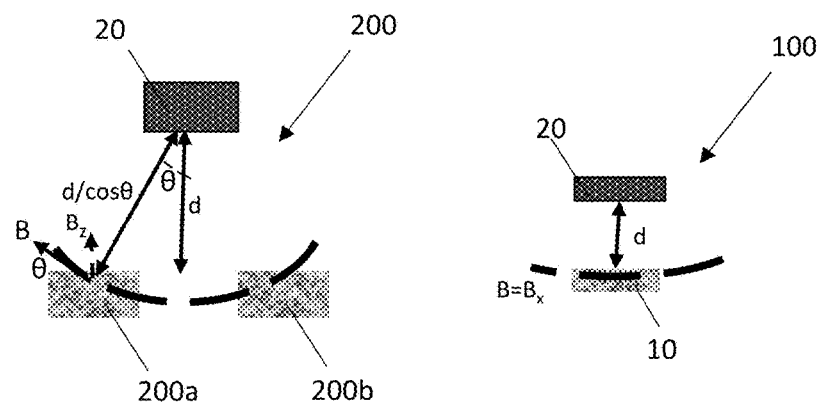
FIG. 5 shows a representative magnetic field (and calculation of a magnetic field) between a vertical sensor in the configuration described herein and that of a planar sensor.

FIG. 5 shows a representative magnetic field (and calculation of a magnetic field) between a vertical Hall device sensing system 100 in the configuration described herein and that of a planar Hall device sensing system 200. As shown in FIG. 5, the vertical Hall device sensing system 100 described herein has a distance "d" between the vertical Hall sensor 10 and the wiring structure 20. In this configuration, the vertical Hall sense field "B" is parallel to the wafer surface, e.g., the vertical Hall sensor 10. Also, B=Bx, where $$B_x = \frac{\mu I}{d},$$

where "d" is distance and "I" is current.

In comparison, the planar Hall device sensing system 200 requires two sensors 200a, 200b, with a single wiring structure 20 at a top wiring level between the two sensors 200a, 200b (i.e., not directly above either sensor 200a, 200b). This is necessary due to the planar Hall sensor needing to sense the magnetic field "Bz" perpendicular to the wafer surface. In this case, $$B_z = \frac{\mu I}{d/\cos\theta} \cdot \sin\theta = \frac{\mu I}{d} \cdot \frac{\sin 2\theta}{2} < \frac{\mu I}{d} \cdot \frac{1}{2}$$

It should be understood by those of skill in the art that the equation $$\frac{\mu I}{d} \cdot \frac{1}{2}$$

is briefly provided herein, with the assumption to ignore the shape of the wire, the area of sensor, etc.

Accordingly, the magnetic field and Hall voltage of the configuration 100 is at least 2× higher magnetic field than the Hall voltage of the configuration 200 due to the configuration 100 having a closer distance between conductor and vertical Hall sensor compared to that with the planar Hall device sensing system 200. This results in an increased sensitivity of the vertical Hall device sensing system 100.

The on-chip sensor can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a vertical Hall sensor; and,
    a current carrying conductor in a first wiring layer directly above and in alignment with the vertical Hall sensor,
    wherein a distance between the vertical Hall sensor and the current carrying conductor is between 1 μm to 5 μm.

2. The structure of claim 1, wherein the current carrying conductor comprises a metal wire, the first wiring layer is a first wiring layer of a plurality of wiring layers, and the plurality of wiring layers are composed of interlevel dielectric material.

3. The structure of claim 2, wherein the metal wire comprises copper.

4. The structure of claim 2, wherein the metal wire comprises aluminum.

5. The structure of claim 1, wherein the vertical Hall sensor comprises two vertical Hall sensors.

6. The structure of claim 5, wherein the current carrying conductor comprises a U-shape with each leg of the U-shape over a respective one of the two vertical Hall sensors.

7. The structure of claim 6, wherein each leg of the current carrying conductor is directly over a respective one of the two vertical Hall sensors.

8. The structure of claim 7, wherein the current carrying conductor comprises a back end of the line (BEOL) structure in a same on-chip package as the two vertical Hall sensors.

9. The structure of claim 1, wherein the current carrying conductor comprises a back end of the line (BEOL) structure in a same on-chip package as the vertical Hall sensor.

10. The structure of claim 1, wherein the vertical Hall sensor comprises a front end of the line (FEOL) structure.

11. A structure comprising:
    a front end of a line Hall sensor; and
    a back end of the line current carrying conductor directly above and in alignment with the Hall sensor in a first wiring level,
    wherein a distance between the Hall sensor and the back end of the line current carrying conductor is between 1 μm to 5 μm.

12. The structure of claim 11, wherein the Hall sensor comprises a vertical Hall sensor in an on-chip package system.

13. The structure of claim 11, wherein the current carrying conductor comprises a metal buried in interlevel dielectric material.

14. The structure of claim 13, wherein the metal comprises copper.

15. The structure of claim 13, wherein the metal comprises aluminum.

16. The structure of claim 11, wherein the Hall sensor comprises two vertical Hall sensors.

17. The structure of claim 16, wherein the current carrying conductor comprises a U-shape with each leg of the U-shape over a respective one of the two vertical Hall sensors.

18. The structure of claim 11, wherein the Hall sensor is placed in a different direction than the current carrying conductor.

19. A method comprising:
- forming a vertical Hall sensor in a front end of line process; and
- forming a current carrying conductor in a first wiring layer directly above and in alignment with the vertical Hall sensor in a back end of the line process,
- wherein a distance between the vertical Hall sensor and the current carrying conductor is between 1 μm to 5 μm.

* * * * *